United States Patent [19]

Dwarakanath et al.

[11] 4,306,196
[45] Dec. 15, 1981

[54] OPERATIONAL AMPLIFIER WITH OFFSET COMPENSATION

[75] Inventors: Mirmira R. Dwarakanath, Berkeley Heights; Douglas G. Marsh, Freehold, both of N.J.

[73] Assignee: Bell Telephone Laboratories, Incorporated, Murray Hill, N.J.

[21] Appl. No.: 111,997

[22] Filed: Jan. 14, 1980

[51] Int. Cl.³ ............................................. H03F 1/02
[52] U.S. Cl. ...................................................... 330/9
[58] Field of Search ........................ 330/9, 51, 69, 259; 328/128, 162, 165

[56] References Cited

U.S. PATENT DOCUMENTS 3,649,924 3/1972 Lucas ...................................... 330/9

*Primary Examiner*—James B. Mullins
*Attorney, Agent, or Firm*—Volker R. Ulbrich

[57] ABSTRACT

Offset voltage compensation is provided by a feedback capacitor (24) in a feedback loop (20). For periodically resetting the compensation, the signal input terminal (14) is grounded by an electronic MOSFET switch (34). Other such switches (22, 26) close the feedback loop (20) in front of the capacitor (24) and connect the output side of the capacitor (24) to ground for recharging. An input capacitor (30) for compensating the switching feed-through charge of the feedback loop switch (22) is connected between the input signal source (32) and the signal input terminal (14). The ratio of the inherent capacitances of the switches (22, 34) is equal to the capacitance ratio of their respective capacitors (24, 30). Also disclosed is a particularly advantageous method for operating the switches. For switching from the reset condition back to the transmit condition, first the feedback loop switch (22) is opened. Thereafter, the other switches (26, 31, 34) are operated.

6 Claims, 6 Drawing Figures

TRANSITION

TRANSMIT

RESET

TRANSITION

TRANSMIT

OPERATIONAL AMPLIFIER WITH OFFSET COMPENSATION

TECHNICAL FIELD

The present invention relates to offset voltage compensation for operational amplifiers, particularly those utilizing FET (field-effect transistor) devices for switching functions.

BACKGROUND OF THE INVENTION

The input offset voltage of an operational amplifier is the voltage which must be applied between its input terminals in order to bring the output voltage to a predetermined reference level when there is no signal input. This offset voltage is a generally known error characteristic of operational amplifiers which is due to an uncontrollable mismatch of components.

For certain applications of operational amplifiers, it is particularly important to eliminate errors which result from uncompensated input offset voltages. Such is the case, for example, for operational amplifiers which are used for charge redistribution codecs in telephone communications, where it is generally desirable to maintain the effects of each internal source of error to less than one-tenth LSB (least significant bit). A particular charge-redistribution codec is described, for example, in Suarez et al., "An ALL-MOS Charge-Redistribution A/D Conversion Technique," 1974, *IEEE Internat. Solid-State Circuits Conference*, p. 194, U.S.A.

It is possible by means of various feedback loop arrangements to adjust the offset voltage on a continuing basis, such as for analog systems. However, such arrangements involve relatively complex circuitry including comparators.

Another and simpler approach is to compensate the offset voltage by means of a voltage source, such as a voltage compensating capacitor, which by means of electronic switching devices, which may be MOSFETS (metal-on-silicon field-effect transistors), is periodically reset to the offset voltage and then connected in series with the signal input to the amplifier. This approach is used in so-called "chopper-stabilized" amplifiers, such as is described, for instance, in U.S. Pat. No. 3,617,913 issued Nov. 2, 1971 to Rolf Schmidhauser et al. This type of stabilization is particularly suitable for digital circuits, since even for a high speed digital signal there is generally sufficient time between input signal pulses for resetting the compensating voltage of the capacitor. It is also an approach particularly suited for integrated circuits, since the required capacitors and MOSFETS can be easily provided in such structures and take up relatively little space. However, the switching devices themselves have an inherent stray capacitance which can introduce a feed-through charge onto the compensating capacitor in the course of their switching and thereby result in a compensating voltage error.

In typical offset voltage compensation arrangements, a compensating capacitor is connected in series with the signal input of the amplifier. Resetting of the capacitor's compensating voltage is accomplished by means of three MOSFET switches. An isolating switch disconnects the signal source from the capacitor, an input reset switch grounds the signal input terminal, and a feedback switch connects the disconnected side of the capacitor to the other feedback input terminal of the amplifier. Before the input signal source can be reconnected to the signal input terminal through the compensating capacitor, it is necessary to open the feedback switch which connects the capacitor to the other input terminal and to also open the input reset switch which grounds the signal input terminal. These switches generally cannot be operated precisely simultaneously and do not have identical switching characteristics, such as stray inherent capacitances.

If the feedback switch opens first, then the two switches will not see the same terminations during opening and will therefore inject different feed-through charges onto the capacitor to result in a substantial net feed-through error. On the other hand, if the input reset switch connecting the signal input terminal to ground opens first, then its feed-through error will be seen by the amplifier as a step input. The response of the amplifier to the step input will be transmitted back through the feedback loop to the other input terminal and to the capacitor, unless the feedback switch can be operated much faster than the response time of the amplifier. For very fast amplifiers, the switch will not be fast enough.

It is known that the charge feed-through error can be reduced by the provision of matching charge compensation devices for the MOSFET switches. The charge compensation devices, however, can themselves bring additional problems. In one approach, the charge compensation devices increase the silicon surface area used and further increases the open switch leakage. A large capacitor could accommodate the increased leakage, but it is desirable to make this capacitor as small as possible in order to minimize both its settling time and the circuit substrate area required for it. Other charge compensation approaches for the electronic switching devices have not led to a sufficient reduction in the offset compensating voltage error.

SUMMARY OF THE INVENTION

The shortcomings of the prior operational amplifiers as discussed above are substantially eliminated in the amplifier arrangement of the invention, wherein an operational amplifier is provided with two capacitors for compensating the offset voltage. One is an input capacitor in series with the signal input terminal of the amplifier and the signal source. The other is a feedback capacitor in the feedback loop between the feedback input terminal and the amplifier output terminal. An input reset means permits the signal input terminal to be connected to a reference potential, or ground. A feedback shunt means for opening the feedback loop between the input side of the feedback capacitor and a feedback reset means for switching the output side of the feedback capacitor between the output of the amplifier and the reference potential permit recharging of the feedback capacitor to the offset potential. With this arrangement, it is possible for feed-through errors to be substantially cancelled out.

PREFERRED EMBODIMENT OF THE INVENTION

Figure 1:
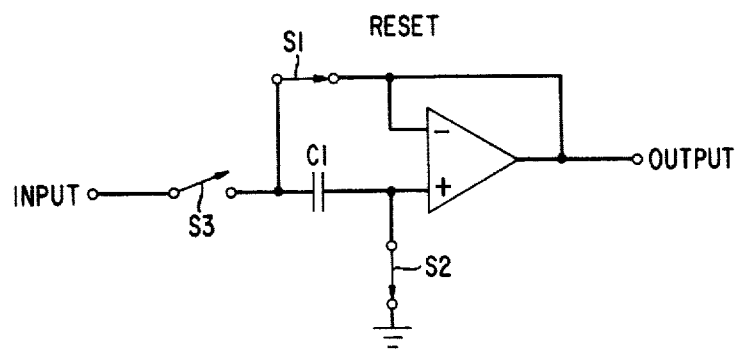
FIGS. 1, 2, and 3 of the drawings show an operational amplifier with an offset voltage compensating circuit arrangement typical of the prior art as discussed above and schematically illustrate the circuit in the reset, transition, and trasmit conditions, respectively.
Figure 2:
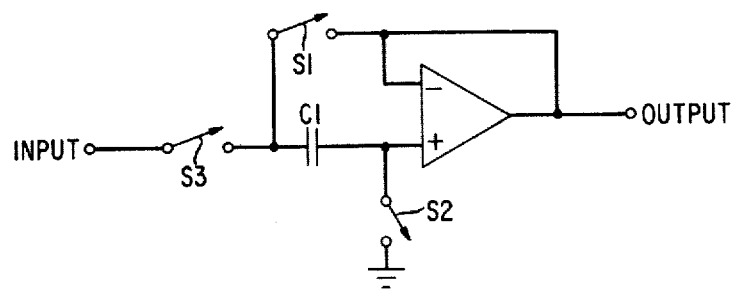
Figure 3:
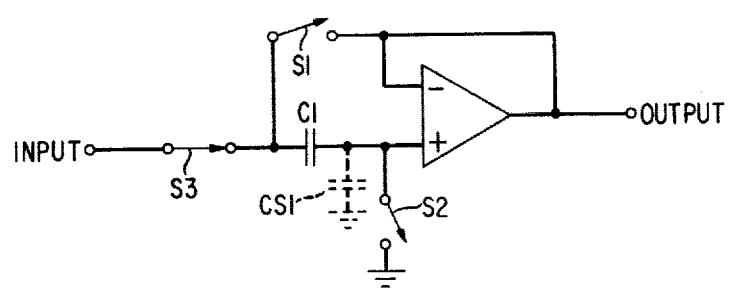
Figure 4:
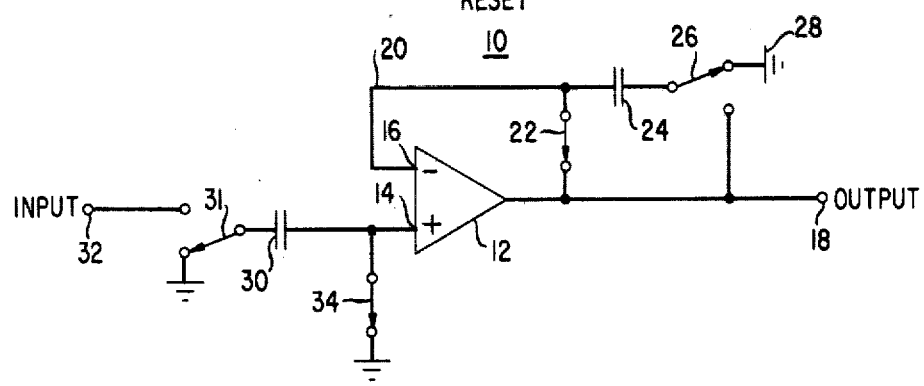
FIGS. 4, 5, and 6 show an operational amplifier with an offset voltage compensation circuit arrangement in accordance with a preferred embodiment of the present invention and schematically illustrate the circuit in the reset, transition and transmit conditions, respectively.
Figure 5:
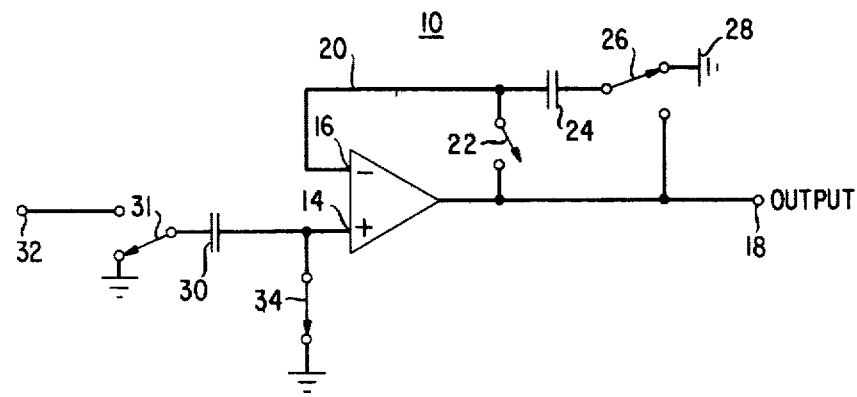
Figure 6:
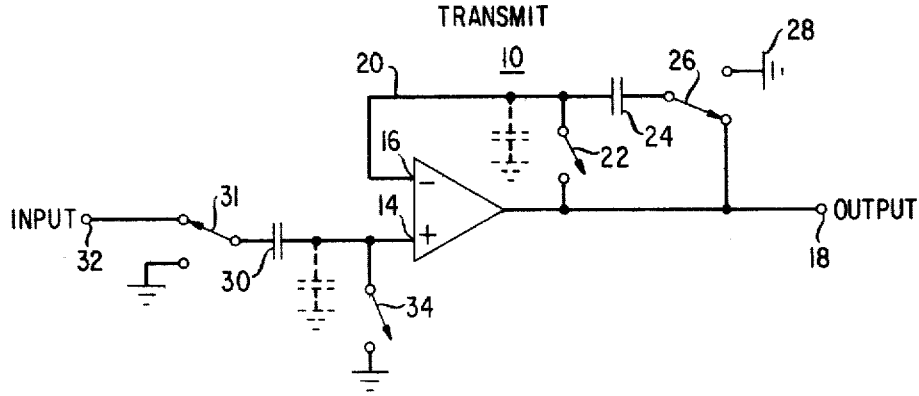

A preferred embodiment of the novel apparatus is illustrated in FIGS. 4, 5, and 6 of the drawings. The apparatus is an operational amplifier circuit of the type which may be used, for example, as a subcircuit in a larger and more complex integrated circuit.

Referring now to the FIGS. 4, 5, and 6, the circuit 10 includes an operational amplifier 12 having a signal input terminal 14, a feedback input terminal 16, a single output terminal 18, and a feedback loop 20 between the feedback input terminal 16 and the output terminal 18. A feedback shunt switch 22 is provided in the feedback loop 20 to permit the loop 20 to be opened. A feedback capacitor 24 with one side connected between the feedback shunt switch 22 and the feedback input terminal 16 has its other side connected to a double-throw feedback reset switch 26 which can selectively switch to a reference potential 28, such as ground potential, or to the output terminal 18. An input capacitor 30 is connected between the signal input terminal 14 and a double-throw signal source switch 31. The switch 31 can selectively connect the input capacitor 30 to the reference potential or to the signal input source 32. An input reset switch 34 is connected between the signal input terminal 14 and the reference potential 28. The switches 22, 26, 34 are all FET devices, such as MOS transistor switches.

In the reset condition of the circuit 10, as shown in FIG. 4, the feedback capacitor 24 is charged to the input offset voltage, while the input terminal 14 is grounded and the input capacitor 30 is discharged.

The transition condition of the circuit 10 is shown in FIG. 5. The feedback shunt switch 22 opens the feedback loop 20. This injects a switching charge feedthrough error onto the feedback capacitor 24. Immediately thereafter, as shown in FIG. 6, the input reset switch 34 opens and injects an equal charge feedthrough error on the input capacitor 30. With the feedback loop 20 open, this action will not affect the charge on the feedback capacitor 24, provided the ratio of the area of the inherent capacitance of the feedback shunt switch 22 to that of the input reset switch 34 is made equal to the ratio of the capacitance of the feedback capacitor 24 to that of the input capacitor 30. The leakage error of these four components will also cancel. Since the stray capacitances of the feedback capacitor 24 and the feedback shunt switch 22 and those of the input capacitor 30 and the input reset switch 34 are in essentially the same ratio as the capacitance ratio of the capacitors 24 and 30, any stray losses at the input terminal 14 are compensated by gain in the amplifier.

The feedback reset switch 26 now connects the feedback capacitor 24 back into the feedback loop 20, and the signal source switch 31 connects the input capacitor 30 to the signal source 32. The charge stored on the feedback capacitor 24 and the input capacitor 30 will at this time not be affected by feed-through error, since the feedback reset switch 26 and the input signal source switch 31 are switching between two low impedance points. The only requirement on the feedback reset switch 26 is that it must not operate until after the feedback shunt switch 22 opens, so that the stored offset voltage on the feedback capacitor 24 is not discharged. The only requirement on the input signal source switch 31 is that it must not operate until after the input reset switch 34 opens, so that no error charge is injected onto the input capacitor 30. As a practical matter, it has been found that with present MOSFET switching devices the reset switch 34, the feedback reset switch 26, and the input source switch 31 need only be delayed by several tens of nanoseconds after the feedback shunt switch 22 opens to insure proper operation. They need not operate simultaneously. Similarly, the input signal source switch 31 need only be delayed by several tens of nanoseconds after the input reset switch 34 opens. The amount of area required for the provision of the capacitors 24, 30 in an integrated circuit is not a significant factor, since it is the ratio of capacitor-to-switch area which is important. For example, the input reset switch 34 can be made three times minimum feasible area and the feedback shunt switch 22 can be made one times minimum feasible area. The feedback capacitor 24 would then be made one-third of the area of input capacitor 30. Since the offset voltage is compensated so that no significant switching error is introduced, the performance is limited only by matching problems.

Where the signal source itself is expected to occasionally return to the reference potential, the input source switch can be eliminated if the reset time for the operational amplifier apparatus 10 can by synchronized with that return of the signal source to the reference potential.

While the components of the circuit of the preferred embodiment used for switching functions are MOSFET devices, as are components of the operational amplifier itself, the present invention is likewise applicable to bipolar switching devices and other types of operational amplifiers. It is particularly advantageous that the apparatus in accordance with the present invention does not require complex circuitry which would be costly to fabricate and would use a significantly additional surface area of an integrated circuit substrate. This makes it particularly suited for large scale integrated circuits.

We claim:

1. An amplifier (12) having a first input terminal (16), a second input terminal (14) for connection to an input signal source (32), an output terminal (18), and a feedback loop (20) connecting said first input terminal with said output terminal, the operating characteristics of the amplifier being such that an input offset voltage compensation is required for stabilizing the output terminal voltage, said amplifier being characterized by:
   a first means (22) arranged to selectively open or close said feedback loop;
   a first capacitor (24) connected at a first side between said first input terminal and said first means;
   a second capacitor (30) connected at a first side to said second input terminal;
   a second means (34) arranged to selectively connect said second input terminal to a reference potential source (28); and
   a third means (26) connected on one side to the second side of said first capacitor and arranged to selectively connect said second side of said first capacitor either to said reference potential source or to said output terminal of said operational amplifier.

2. The amplifier in accordance with claim 1 and comprising a fourth means (31) connected on the one side to a second side of said second capacitor and arranged to selectively connect said second capacitor to said signal source or to said reference potential source.

3. The amplifier apparatus in accordance with claim 1, wherein the ratio of the inherent capacitance of said first means to the inherent capacitance of said second means is substantially equal to the ratio of the capacitance of said first capacitor to the capacitance of said second capacitor.

4. The amplifier apparatus in accordance with claim 1 or claim 2, wherein said first, second, third, and fourth means are electronic switching devices.

5. A method of compensating the input offset voltage of an operational amplifier (12) having a signal input terminal (14), a feedback input terminal (16), a feedback loop (20) and an output terminal (18), characterized by the steps of:
supplying a voltage in the feedback loop (20) by means of a feedback capacitor (24) which is charged to substantially the magnitude of the offset voltage of the amplifier (12) and has the opposite polarity, so that the offset voltage of the amplifier (12) is compensated, and
periodically recharging the capacitor (24) to the offset voltage by closing the feedback loop (20) between the capacitor (24) and the output terminal (18), connecting the side of the capacitor (24) remote from the feedback loop (20) to a reference potential (28), connecting the signal input terminal (14) to the reference potential (28), and bringing the signal side of an input capacitor (30) to the reference potential (28).

6. The method according to claim 5 comprising switching the recharged capacitor (24) back into the feedback loop by:
opening the feedback loop (20) between the capacitor (24) and the output terminal (18), and then
disconnecting the side of the capacitor (24) remote from the feedback loop (20) from the reference potential (28) and connecting it to the output terminal (18), and
disconnecting the input terminal (14) from the reference potential (28) and then connecting it to an input signal source (32) through the input capacitor (30).

* * * * *